(12) United States Patent
Cho et al.

(10) Patent No.: US 12,379,747 B2
(45) Date of Patent: *Aug. 5, 2025

(54) FOLDABLE DISPLAY DEVICE

(71) Applicant: LG Display Co., Ltd., Seoul (KR)

(72) Inventors: Eunae Cho, Paju-si (KR); Seungkyu Lee, Bucheon-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/497,359

(22) Filed: Oct. 30, 2023

(65) Prior Publication Data

US 2024/0062685 A1 Feb. 22, 2024

Related U.S. Application Data

(63) Continuation of application No. 17/890,584, filed on Aug. 18, 2022, now Pat. No. 11,893,912, which is a
(Continued)

(30) Foreign Application Priority Data

Dec. 10, 2019 (KR) ........................ 10-2019-0163880

(51) Int. Cl.
*G06F 1/16* (2006.01)
*G09F 9/30* (2006.01)
(Continued)

(52) U.S. Cl.
CPC .......... *G06F 1/1652* (2013.01); *G06F 1/1616* (2013.01); *G06F 1/1656* (2013.01);
(Continued)

(58) Field of Classification Search
CPC .......... G09F 9/301; G09F 9/33; G06F 1/1616; G06F 1/1656; G06F 1/1652;
(Continued)

(56) References Cited

U.S. PATENT DOCUMENTS 9,685,630 B2* 6/2017 Choi .................... H10K 50/844
9,811,119 B2 11/2017 Seo
(Continued)

FOREIGN PATENT DOCUMENTS

CN 105659187 A 6/2016
CN 105826350 A 8/2016
(Continued)

*Primary Examiner* — Rockshana D Chowdhury
(74) *Attorney, Agent, or Firm* — Seed IP Group LLP

(57) ABSTRACT

Provided is a foldable display device that includes a display panel having a folding area and non-folding areas. The device includes a back plate under the display panel, a first support layer under the back plate and having an opening pattern in a portion thereof corresponding to the folding area, and an impact absorbing layer under the first support layer. The impact absorbing layer includes a first portion corresponding to the folding area and a second portion corresponding to the non-folding areas, and a modulus of the first portion is greater than a modulus of the second portion. Accordingly, even when a point impact is applied to the folding area, the point impact is converted into a surface impact, so that damage to the display panel or the touch panel by the point impact can be prevented more effectively. Consequently, impact resistance characteristics of the display device may be improved.

20 Claims, 5 Drawing Sheets

Related U.S. Application Data continuation of application No. 17/109,983, filed on Dec. 2, 2020, now Pat. No. 11,455,915.

(51) Int. Cl.
    *H10K 59/10*     (2023.01)
    *H10K 59/40*     (2023.01)

(52) U.S. Cl.
    CPC .............. *G09F 9/301* (2013.01); *H10K 59/10* (2023.02); *H10K 59/40* (2023.02)

(58) Field of Classification Search
    CPC .......... G06F 2203/04102; H10K 59/40; H10K 59/10; H10K 77/111; H10K 2102/311; Y02E 10/549
    See application file for complete search history.

(56) References Cited

U.S. PATENT DOCUMENTS

| | | | |
|---|---|---|---|
| 9,983,424 B2 | 5/2018 | Kim et al. | |
| 10,297,648 B2 * | 5/2019 | Ma | H10K 59/38 |
| 10,345,856 B2 | 7/2019 | Song | |
| 10,446,769 B2 | 10/2019 | Kim et al. | |
| 10,798,831 B2 | 10/2020 | Shin et al. | |
| 10,908,639 B2 | 2/2021 | Shibayama et al. | |
| 11,048,295 B1 | 6/2021 | Smeeton | |
| 11,227,515 B2 | 1/2022 | Kim et al. | |
| 11,296,286 B2 * | 4/2022 | Seo | B32B 7/12 |
| 11,322,520 B2 | 5/2022 | Kachatryan et al. | |
| 11,455,915 B2 * | 9/2022 | Cho | G06F 1/1656 |
| 11,501,668 B2 * | 11/2022 | Wang | G06F 1/1616 |
| 11,508,922 B2 * | 11/2022 | Park | G06F 1/1652 |
| 11,528,819 B2 * | 12/2022 | Lee | H05K 5/0226 |
| 2014/0204291 A1 * | 7/2014 | Kung | G06F 3/041 349/12 |
| 2015/0049428 A1 | 2/2015 | Lee et al. | |
| 2015/0055287 A1 | 2/2015 | Seo | |
| 2016/0211482 A1 | 7/2016 | Namkung | |
| 2016/0218305 A1 | 7/2016 | Kim et al. | |
| 2016/0233453 A1 | 8/2016 | Lee et al. | |
| 2016/0240817 A1 | 8/2016 | Cho et al. | |
| 2016/0357052 A1 | 12/2016 | Kim et al. | |
| 2017/0153668 A1 | 6/2017 | Jang et al. | |
| 2018/0053451 A1 | 2/2018 | Han | |
| 2018/0122830 A1 | 5/2018 | Kachatryan et al. | |
| 2018/0130974 A1 | 5/2018 | Koo et al. | |
| 2018/0136371 A1 | 5/2018 | Kim et al. | |
| 2018/0175131 A1 | 6/2018 | Lee | |
| 2018/0192527 A1 * | 7/2018 | Yun | G09F 9/301 |
| 2019/0036068 A1 * | 1/2019 | Kim | G06F 1/1652 |
| 2019/0067606 A1 | 2/2019 | Han et al. | |
| 2019/0081274 A1 * | 3/2019 | Choi | H10K 59/122 |
| 2019/0132947 A1 | 5/2019 | Koo et al. | |
| 2019/0181206 A1 | 6/2019 | Cao | |
| 2019/0207141 A1 | 7/2019 | Kim et al. | |
| 2019/0250665 A1 | 8/2019 | Kim | |
| 2019/0334114 A1 | 10/2019 | Park | |
| 2020/0047451 A1 | 2/2020 | Dong et al. | |
| 2020/0166970 A1 | 5/2020 | Yeom | |
| 2020/0227678 A1 | 7/2020 | Seo | |
| 2020/0380893 A1 | 12/2020 | Park et al. | |
| 2021/0036259 A1 * | 2/2021 | Song | H10K 59/8793 |
| 2021/0066626 A1 * | 3/2021 | Park | G02F 1/133305 |
| 2021/0068276 A1 | 3/2021 | Kim et al. | |
| 2021/0090475 A1 | 3/2021 | Wang et al. | |
| 2021/0104694 A1 | 4/2021 | Yee | |
| 2021/0118337 A1 | 4/2021 | Park et al. | |
| 2021/0168929 A1 | 6/2021 | Wang et al. | |
| 2021/0174711 A1 | 6/2021 | Cho et al. | |
| 2021/0184161 A1 * | 6/2021 | Song | H10K 77/111 |
| 2021/0192984 A1 | 6/2021 | Yoo et al. | |
| 2021/0200268 A1 | 7/2021 | Lee | |
| 2021/0251090 A1 | 8/2021 | Ha et al. | |
| 2021/0341970 A1 | 11/2021 | Lee et al. | |
| 2021/0382367 A1 | 12/2021 | Hashimoto et al. | |
| 2022/0059795 A1 | 2/2022 | Kim et al. | |
| 2022/0071026 A1 | 3/2022 | Ha et al. | |
| 2022/0093012 A1 | 3/2022 | Lee et al. | |
| 2022/0114923 A1 | 4/2022 | Ha et al. | |

FOREIGN PATENT DOCUMENTS

| | | |
|---|---|---|
| CN | 106252378 A | 12/2016 |
| CN | 106652802 A | 5/2017 |
| CN | 106875845 A | 6/2017 |
| CN | 108206200 A | 6/2018 |
| CN | 109560043 A | 4/2019 |
| CN | 110009996 A | 7/2019 |
| KR | 10-2016-0144912 A | 12/2016 |
| KR | 20170023231 A | 3/2017 |
| KR | 20170063344 A | 6/2017 |
| KR | 20190077903 A | 7/2019 |
| TW | I619102 B | 3/2018 |
| TW | I661344 B | 6/2019 |

* cited by examiner

FOLDABLE DISPLAY DEVICE

CROSS-REFERENCE TO RELATED APPLICATIONS

This application is a continuation of U.S. patent application Ser. No. 17/890,584, filed Aug. 18, 2022; which is a continuation of U.S. patent application Ser. No. 17/109,983, filed Dec. 2, 2020; which claims the benefit of Korean Patent Application No. 10-2019-0163880, filed Dec. 10, 2019, with the Korean Intellectual Property Office, the disclosure of which is incorporated herein by reference.

BACKGROUND

Technical Field

The present disclosure relates to a foldable display device, and more particularly, to a foldable display device having improved impact resistance.

Description of the Related Art

Recently, as society advances toward an information-oriented society, the field of display devices for processing and displaying a large amount of information has rapidly advanced, and various flat display devices are being developed correspondingly.

Specific examples of such a flat display device include a liquid crystal display device (LCD), a field emission display device (FED), an electroluminescence display device (ELD), an organic light emitting diode (OLED), and the like. These flat display devices exhibit excellent performance in terms of thinness, weight reduction, and low power consumption and thus, are rapidly replacing existing cathode ray tubes (CRT).

Meanwhile, such a flat display device has limitations in reducing a weight and thickness and providing flexibility since it uses a glass substrate so as to withstand high heat generated during a manufacturing process.

Accordingly, flexible display devices manufactured to maintain display performance intact even when they bend like paper, using a flexible material such as plastic or the like, instead of an existing inflexible glass substrate, are rapidly emerging as next-generation flat display devices.

Such flexible display devices may be classified into an unbreakable type, having high durability by using a plastic thin film transistor substrate, instead of glass, a bendable type without being broken, a rollable type capable of being rolled up, a foldable type capable of being folded, and the like. These flexible display devices have advantages in terms of space use and interior design and can be utilized in various application fields.

In particular, recently, to realize a large area together with slimness, weight reduction and miniaturization, foldable display devices capable of being portable in a folded state and displaying an image in an unfolded state are being actively studied.

The foldable display devices can be applied not only to mobile devices such as mobile phones, ultra-mobile PCs, e-books, and electronic newspapers, but also be applied to the field of various applications, such as TVs and monitors.

Such a foldable display device includes a display panel for implementing an image, a back plate positioned under the display panel to support the display panel, and a cover window positioned in front of the display panel to protect the display panel.

BRIEF SUMMARY

The inventors of the present disclosure have appreciated that due to the structures and operations of the foldable display device, the display is capable of being folded and unfolded, and all of the back plate, the cover window, the display panel, are configured in a very thin film form. Further, such thin film form transmits most of the impacts transmitted from the outside, vertically. The inventors have realized that as the cover window and the back plate are in a thin film form, when an impact is applied from the outside to the cover window or back plate, the impact applied from the outside is transmitted directly to the display panel positioned between the cover window and the back plate. This, in turn, causes damage to the display panel, thereby degrading display quality of the display panel.

The inventors have come up with various structures for reducing resistance. For example, one or more embodiments of the present disclosure provides a foldable display device having improved impact resistance.

Further embodiments of the present disclosure provides a foldable display device capable of preventing degradation in display quality.

Technical benefits of the present disclosure are not limited to the above-mentioned benefits, and other benefits, which are not mentioned above, can be clearly understood by those skilled in the art from the following descriptions.

According to an aspect of the present disclosure, a foldable display device may include a display panel including a folding area and non-folding areas on both sides of the folding area. A back plate may be disposed under the display panel, and a first support layer is disposed under the back plate and has an opening pattern in a portion thereof corresponding to the folding area. An impact absorbing layer may be disposed under the first support layer. The impact absorbing layer may include a first portion corresponding to the folding area and a second portion corresponding to the non-folding areas, and a modulus of the first portion may be greater than a modulus of the second portion.

Other detailed matters of the embodiments are included in the detailed description and the drawings.

In the foldable display device according to an embodiment of the present disclosure, the first portion of the impact absorbing layer corresponding to the folding area of the display panel is formed of a material having a high modulus. Accordingly, even when a point impact is applied to the folding area, the point impact is converted into a surface impact, so that damage to the display panel or the touch panel by the point impact can be prevented more effectively. Consequently, impact resistance characteristics of the display device may be improved.

Since the technical problems to be solved, the problem-solving means, and the effects described in the specification are not intended to limit the essential features of the claims. Accordingly, the scope of the claims is not limited by the contents described in the specification.

BRIEF DESCRIPTION OF THE SEVERAL VIEWS OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
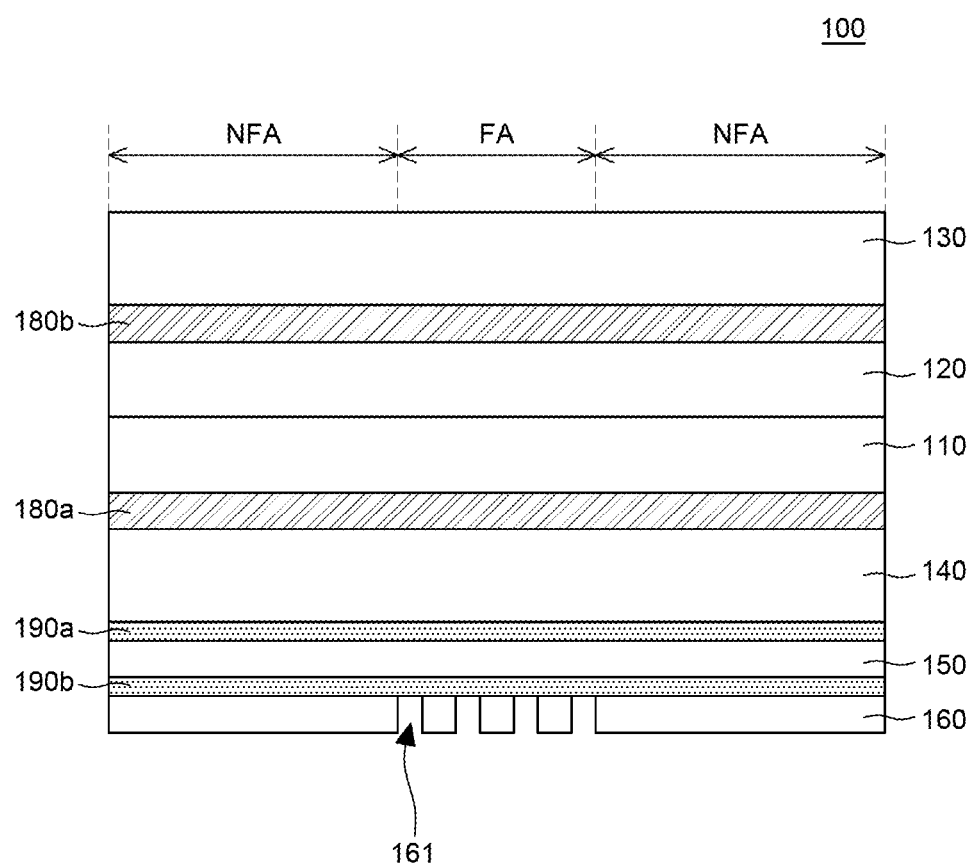
FIG. 1 is a schematic cross-sectional view of a foldable display device of the present disclosure.

Advantages and characteristics of the present disclosure and a method of achieving the advantages and characteristics will be clear by referring to embodiments described below in detail together with the accompanying drawings. However, the present disclosure is not limited to the embodiments disclosed herein but will be implemented in various forms. The embodiments are provided by way of example only so that those skilled in the art can fully understand the disclosures of the present disclosure and the scope of the present disclosure.

The shapes, sizes, ratios, angles, numbers, and the like illustrated in the accompanying drawings for describing the embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having" used herein are generally intended to allow other components to be added unless the terms are used with the term "only." Any references to singular may include plural unless expressly stated otherwise.

Components are interpreted to include an ordinary error range even if not expressly stated.

When the position relation between two parts is described using the terms such as "on," "above," "below," and "next," one or more parts may be positioned between the two parts unless the terms are used with the term "immediately" or "directly."

When an element or layer is disposed "on" another element or layer, another layer or another element may be interposed directly on the other element or therebetween.

Although the terms "first," "second," and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, a display device according to embodiments of the present disclosure will be described in detail with reference to accompanying drawings.

Figure 2:
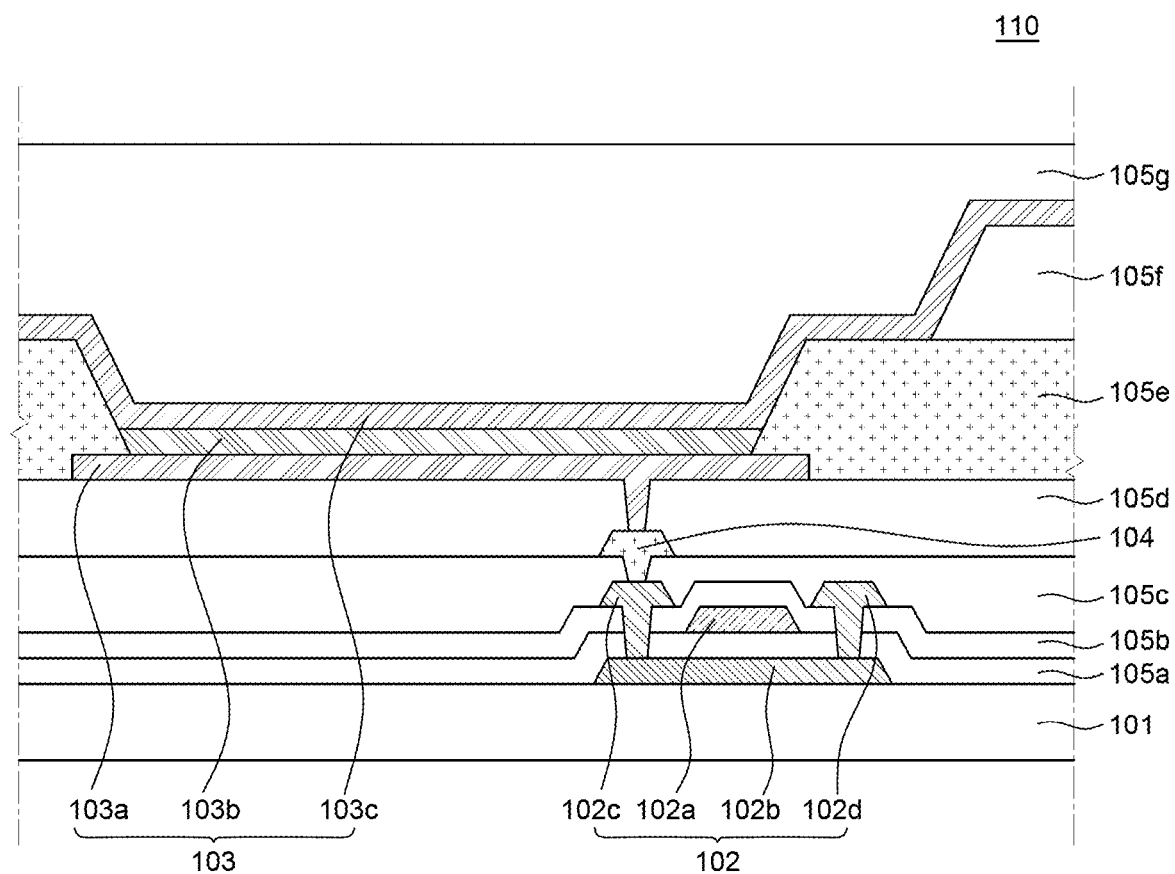
FIG. 2 is a schematic cross-sectional view of a display panel of FIG. 1.

FIG. 1 is a schematic cross-sectional view of a foldable display device according to a first embodiment of the present disclosure. FIG. 2 is a schematic cross-sectional view of a display panel of FIG. 1.

As illustrated, a foldable display device 100 includes a display panel 110 for implementing an image, a touch panel 120 including a touch sensor (not shown), a cover window 130 for protecting the display panel 110, a back plate 140 for supporting the display panel 110, a first support layer 160 disposed under the back plate 140 and having an opening pattern 161, and a second support layer 150 between the back plate 140 and the first support layer 160.

At this time, when defining directions in drawings for convenience of explanation, based on the premise that a display surface of the display panel 110 faces frontward, the back plate 140, the first support layer 160, and the second support layer 150 are positioned in the rear of the display panel 110, and the cover window 130 is positioned in front of the display panel 110.

The touch panel 120 is positioned between the display panel 110 and the cover window 130. The respective components adhere and are attached to one another through adhesives 180a, 180b, 190a, 190b.

Here, the display panel 110 may be formed of one of a liquid crystal display device (LCD), a field emission display device (FED), an electroluminescence display device (ELD), and an organic light emitting diode (OLED), but it is preferable to use the OLED, which is a representative of a flexible display device that can maintain display performance intact even when it bends like paper.

The OLED is a self-light emitting device and can be manufactured to be light and thin since it does not require a backlight used in a liquid crystal display device, which is a non-light emitting device.

In addition, the OLED has a viewing angle and a contrast ratio superior to those of the liquid crystal display device, and is advantageous in terms of power consumption, DC low voltage driving and a fast response speed. Further, since internal components of the OLED are solid, the OLED is resistant to external impacts and has a wide use temperature range.

In particular, since a manufacturing process of the OLED is simple, there is an advantage of reducing a production cost more than that of an existing liquid crystal display device.

In the display panel 110 formed of such an OLED, a substrate 101 on which a driving thin film transistor 102 and a light emitting element 103 are formed is encapsulated by an encapsulation part 105g.

Here, with reference to FIG. 2, the display panel formed of the OLED (hereinafter, referred to as an OLED panel) will be described in detail.

With reference to FIG. 2, the substrate 101 serves to support and protect components of the foldable display device 100 disposed thereon.

Recently, the flexible substrate 101 may be formed of a ductile material having flexible characteristics such as plastic.

The flexible substrate 101 may be in a form of film including one of a polyester-based polymer, a silicone-based polymer, an acrylic-based polymer, a polyolefin-based polymer, and a copolymer thereof.

For example, the flexible substrate 101 may be formed of at least one of polyethylene terephthalate (PET), polybutylene terephthalate (PBT), polysilane, polysiloxane, polysilazane, polycarbosilane, polyacrylate, polymethacrylate, polymethylacrylate, polyethylmetacrylate, polyethylacrylate, polyethylmethacrylate, a cyclic olefin copolymer (COC), a cyclic olefin polymer (COP), polyethylene (PE), polypropylene (PP), polyimide (PI), polymethylmethacrylate (PMMA), polystyrene (PS), polyacetal (POM), polyether ether ketone (PEEK), polyestersulfone (PES), polytetrafluoroethylene (PTFE), polyvinylchloride (PVC), polycarbonate (PC), polyvinylidenefluoride (PVDF), a perfluoroalkyl polymer (PFA), a styrene acrylonitrile copolymer (SAN), and combinations thereof.

A buffer layer may be further disposed on the flexible substrate 101. The buffer layer prevents penetration of moisture or other impurities from the outside through the flexible substrate 101 and may planarize a surface of the flexible substrate 101. The buffer layer is not necessarily a necessary component, and may not be included depending on a type of the thin film transistor 102 disposed on the flexible substrate 101.

The thin film transistor 102 is disposed on the flexible substrate 101 and may include a gate electrode 102a, a source electrode 102d, a drain electrode 102c and a semiconductor layer 102b.

In this case, the semiconductor layer 102b may be composed of amorphous silicon or polycrystalline silicon, but is not limited thereto. Polycrystalline silicon has superior mobility than amorphous silicon and low energy power consumption and excellent reliability, and thus, may be applied to a driving thin film transistor within the pixel.

The semiconductor layer 102b may be formed of an oxide semiconductor. The oxide semiconductor has excellent mobility and uniformity properties. The oxide semiconductor may be formed of a quaternary metal oxide such as an indium tin gallium zinc oxide (InSnGaZnO)-based material, a ternary metal oxide such as an indium gallium zinc oxide (InGaZnO)-based material, an indium tin zinc oxide (InSnZnO)-based material, an tin gallium zinc oxide (SnGaZnO)-based material, an aluminum gallium zinc oxide (AlGaZnO)-based material, an indium aluminum zinc oxide (InAlZnO)-based material, and a tin aluminum zinc oxide (SnAlZnO)-based material, or a binary metal oxide such as an indium zinc oxide (InZnO)-based material, a tin zinc oxide (SnZnO)-based material, an aluminum zinc oxide (AlZnO)-based material, a zinc magnesium oxide (ZnMgO)-based material, a tin magnesium oxide (SnMgO)-based material, an indium magnesium oxide (InMgO)-based material, an indium gallium oxide (InGaO)-based material, an indium oxide (InO)-based material, a tin oxide (SnO)-based material, and a zinc oxide (ZnO)-based material. Composition ratios of respective elements included in the oxide semiconductor are not limited.

The semiconductor layer 102b may include a source region including a p-type or n-type impurity, a drain region, and a channel region between the source region and the drain region. The semiconductor layer 102b may further include a low concentration doped region between the source region and the drain region adjacent to the channel region.

The source region and the drain region are doped with a high concentration of impurity, and may be connected to the source electrode 102d and the drain electrode 102c of the thin film transistor 102, respectively.

As an impurity ion, the p-type impurity or n-type impurity may be used. The p-type impurity may be one of boron (B), aluminum (Al), gallium (Ga), and indium (In), and the n-type impurity may be one of phosphorus (P), arsenic (As), and antimony (Sb).

The channel region of the semiconductor layer 102b may be doped with the n-type impurity or p-type impurity according to an NMOS or PMOS thin film transistor structure, and the thin film transistor included in the foldable display device 100 according to an embodiment of the present disclosure may be an NMOS or PMOS thin film transistor.

A first insulating layer 105a is an insulating layer composed of a single layer of silicon oxide (SiOx) or silicon nitride (SiNx) or multiple layers thereof, and may be disposed such that a current flowing through the semiconductor layer 102b does not flow to the gate electrode 102a. In addition, silicon oxide is less ductile than metal, but is superior in ductility to silicon nitride, and may be formed as a single layer or multiple layers depending on characteristics thereof.

The gate electrode 102a serves as a switch for turning on or turning off the thin film transistor 102 based on an electric signal transmitted from the outside through the gate line, and may be composed of a single layer or multiple layers of a conductive metal such as copper (Cu), aluminum (Al), molybdenum (Mo), chromium (Cr), gold (Au), titanium (Ti), nickel (Ni), and neodymium (Nd), or alloys thereof. However, embodiments are not limited thereto.

The source electrode 102d and the drain electrode 102c are connected to the data line, and may enable an electric signal transmitted from the outside to be transmitted from the thin film transistor 102 to the light emitting element 103. The source electrode 102d and the drain electrode 102c may be composed of a single layer or multiple layers of a conductive metal such as copper (Cu), aluminum (Al), molybdenum (Mo), chromium (Cr), gold (Au), titanium (Ti), nickel (Ni), and neodymium (Nd), or alloys thereof, but are not limited thereto.

To insulate the gate electrode 102a and the source electrode 102d and the drain electrode 102c from each other, a second insulating layer 105b composed of a single layer or multiple layers of silicon oxide (SiOx) or silicon nitride (SiNx) may be disposed between the gate electrode 102a and the source electrode 102d and the drain electrode 102c.

A passivation layer formed of an inorganic insulating layer such as silicon oxide (SiOx) or silicon nitride (SiNx) may be disposed on the thin film transistor 102.

The passivation layer may prevent unnecessary electrical connections between components disposed over and under the passivation layer and prevent contamination or damage from the outside. The passivation layer may be omitted depending on configurations and characteristics of the thin film transistor 102 and the light emitting element 103.

Structures of the thin film transistor 102 may be divided into an inverted-staggered structure and a coplanar structure according to positions of elements constituting the thin film transistor 102. For example, the thin film transistor having an inverted-staggered structure refers to a thin film transistor having a structure in which a gate electrode is positioned opposite to a source electrode and a drain electrode based on a semiconductor layer. As in FIG. 2, the thin film transistor 102 having a coplanar structure refers to a thin film transistor having a structure in which the gate electrode 102a is positioned on the same side as the source electrode 102d and the drain electrode 102c based on the semiconductor layer 102b.

In FIG. 2, the thin film transistor 102 having a coplanar structure is illustrated, but the foldable display device 100 according to an embodiment of the present disclosure may also include a thin film transistor having an inverted-staggered structure.

For convenience of description, only a driving thin film transistor is illustrated among various thin film transistors that may be included in the foldable display device 100. A switching thin film transistor, a capacitor, or the like may also be included in the foldable display device 100.

In addition, when a signal is applied from the gate line to the switching thin film transistor, the switching thin film transistor transmits the signal from the data line to a gate electrode of the driving thin film transistor. The driving thin film transistor may transmit a current transferred through power lines to an anode 103a by the signal transmitted from the switching thin film transistor, and control light emission by the current transmitted to the anode 103a.

Planarization layers 105c and 105d may be disposed on the thin film transistor 102 to protect the thin film transistor 102, to alleviate a step caused by the thin film transistor 102, and to reduce parasitic capacitance generated between the thin film transistor 102 and the gate line and the data line, and the light emitting elements 103.

The planarization layers 105c and 105d may be formed of one or more of acrylic resin, epoxy resin, phenolic resin, polyamides resin, polyimides resin, unsaturated polyesters resin, polyphenylene resin, polyphenylene sulfides resin and benzocyclobutene, but are not limited thereto.

The foldable display device 100 according to an embodiment of the present disclosure may include a first planarization layer 105c and a second planarization layer 105d that are sequentially stacked. That is, the first planarization layer 105c may be disposed on the thin film transistor 102 and the second planarization layer 105d may be disposed on the first planarization layer 105c.

A buffer layer may be disposed on the first planarization layer 105c. The buffer layer may be composed of multiple layers of silicon oxide (SiOx) to protect components disposed on the first planarization layer 105c, and may be omitted depending on configurations and characteristics of the thin film transistor 102 and the light emitting element 103.

An intermediate electrode 104 may be connected to the thin film transistor 102 through a contact hole formed in the first planarization layer 105c. The intermediate electrode 104 is stacked to be connected to the thin film transistor 102, and the data line may also be formed in a multilayer structure.

The data line may be formed to have a structure in which a lower layer formed of the same material as the source electrode 102d and the drain electrode 102c and an upper layer formed of the same material as the intermediate electrode 104 are connected to each other. That is, the data line may be implemented in a structure in which two layers are connected in parallel to each other, and in this case, line resistance of the data line may be reduced.

Meanwhile, a passivation layer formed of an inorganic insulating layer such as silicon oxide (SiOx) or silicon nitride (SiNx) may be further disposed on the first planarization layer 105c and the intermediate electrode 104. The passivation layer may serve to prevent unnecessary electrical connections between components and to prevent contamination or damage from the outside, and may be omitted depending on configurations and characteristics of the thin film transistor 102 and the light emitting element 103.

The light emitting element 103 disposed on the second planarization layer 105d may include the anode 103a, a light emitting unit 103b, and a cathode 103c.

The anode 103a may be disposed on the second planarization layer 105d.

The anode 103a serves to supply holes to the light emitting unit 103b and is connected to the intermediate electrode 104 through a contact hole in the second planarization layer 105d to thereby be electrically connected to the thin film transistor 102.

The anode 103a may be formed of a transparent conductive material, such as indium tin oxide (ITO), indium zinc oxide (IZO), or the like, but is not limited thereto.

When the foldable display device 100 is a top emission type display device that emits light to an upper portion thereof where the cathode 103c is disposed, it may further include a reflective layer such that the emitted light is reflected from the anode 103a to be smoothly emitted in a direction toward the upper portion where the cathode 103c is disposed.

The anode 103a may be a two-layer structure in which a transparent conductive layer formed of a transparent conductive material and a reflective layer are sequentially stacked, or a three-layer structure in which a transparent conductive layer, a reflective layer and a transparent conductive layer are sequentially stacked. The reflective layer may be formed of silver (Ag) or an alloy including silver.

A bank 105e disposed on the anode 103a and the second planarization layer 105d may define sub-pixels by dividing areas that actually emits light. After forming a photoresist on the anode 103a, the bank 105e may be formed by photolithography. Photoresist refers to a photosensitive resin whose solubility in a developer is changed by the action of light, and a specific pattern may be obtained by exposing and developing the photoresist. Types of photoresist may be classified into a positive photoresist and a negative photoresist. The positive photoresist is a photoresist where solubility of an exposed portion thereof in the developer is increased by exposure. When the positive photoresist is developed, a pattern from which exposed portions are removed is obtained. The negative photoresist is a photoresist where solubility of the exposed portion thereof in the developer is significantly lowered by the exposure. When the negative photoresist is developed, a pattern from which non-exposed portions are removed is obtained.

A fine metal mask (FMM) which is a deposition mask, may be used to form the light emitting unit 103b of the light emitting element 103.

In addition, to prevent damage that may occur due to contact with the deposition mask disposed on the bank 105e and to maintain a constant distance between the bank 105e and the deposition mask, a spacer 105f formed of one of polyimide which is a transparent organic material, photo acryl, and benzocyclobutene (BCB) may be disposed on the bank 105e.

The light emitting unit 103b may be disposed between the anode 103a and the cathode 103c.

The light emitting unit 103b serves to emit light and may include at least one of a hole injection layer (HIL), a hole transport layer (HTL), a light emitting layer, an electron transport layer (ETL), and an electron injection layer (EIL), and some components may be omitted depending on a structure or characteristics of the foldable display device 100. Here, an electroluminescent layer and an inorganic emitting layer may be applied to the light emitting layer.

The hole injection layer is disposed on the anode 103a to facilitate an injection of holes.

The hole transport layer is disposed on the hole injection layer to smoothly transport holes to the light emitting layer.

The light emitting layer is disposed on the hole transport layer and may include a material capable of emitting light of a specific color to thereby emit light of a specific color. In addition, a luminescent material may be formed using a phosphorescent material or a fluorescent material.

The electron injection layer may be further disposed on the electron transport layer. The electron injection layer is an organic layer that facilitates an injection of electrons from the cathode 103c and may be omitted depending on the structure and characteristics of the foldable display device 100.

On the other hand, at a position adjacent to the light emitting layer, an electron blocking layer or a hole blocking layer that blocks a flow of holes or electrons is further disposed to prevent a phenomenon in which when electrons are injected into the light emitting layer, the electrons move from the light emitting layer and pass to the adjacent hole transport layer or a phenomenon in which when holes are injected into the light emitting layer, the holes move from the light emitting layer and pass to the adjacent electron transport layer, so that luminous efficiency may be improved.

The cathode 103c is disposed on the light emitting unit 103b and serves to supply electrons to the light emitting unit 103b. Since the cathode 103c needs to supply electrons, it may be formed of a metal material such as magnesium (Mg), silver-magnesium (Ag:Mg), which is a conductive material having a low work function, and is not limited thereto.

When the foldable display device 100 is a top emission type display device, the cathode 103c may be a transparent conductive oxide such as indium tin oxide (ITO), indium zinc oxide (IZO), indium tin zinc oxide (ITZO), zinc oxide (ZnO), and tin oxide (TO).

The encapsulation part 105g may be disposed on the light emitting element 103 to prevent the thin film transistor 102 and the light emitting element 103, which are components of the foldable display device 100, from being oxidized or damaged due to moisture, oxygen, or impurities introduced from the outside. The encapsulation part 105g may be formed by stacking a plurality of encapsulation layers, a foreign material compensation layer, and a plurality of barrier films.

The encapsulation layer may be disposed on the entire surface of an upper portion of the thin film transistor 102 and the light emitting element 103, and may be formed of one of silicon nitride (SiNx) or aluminum oxide (AlyOz) which is an inorganic material. However, embodiments are not limited thereto. An encapsulation layer may be further disposed on the foreign material compensation layer disposed on the encapsulation layer.

The foreign material compensation layer is disposed on the encapsulation layer, and an organic material such as silicon oxycarbon (SiOCz), acrylic (acryl), or epoxy-based resin may be used for the foreign material compensation layer. However, embodiments are not limited thereto. When a defect occurs due to a crack generated by a foreign material or particles that may be generated during a process, it may be compensated for by covering a curve and a foreign material by the foreign material compensation layer.

A barrier film may be disposed on the encapsulation layer and the foreign material compensation layer, whereby the foldable display device 100 may delay the penetration of oxygen and moisture from the outside. The barrier film is configured in the form of a light-transmissive and double-sided adhesive film, and may be composed of any one of olefin-based, acrylic-based, and silicon-based insulating materials. Alternatively, a barrier film composed of any one of COP (cycloolefin polymer), COC (cycloolefin copolymer) and PC (Polycarbonate) may be further stacked, but is not limited thereto.

Figure 3:
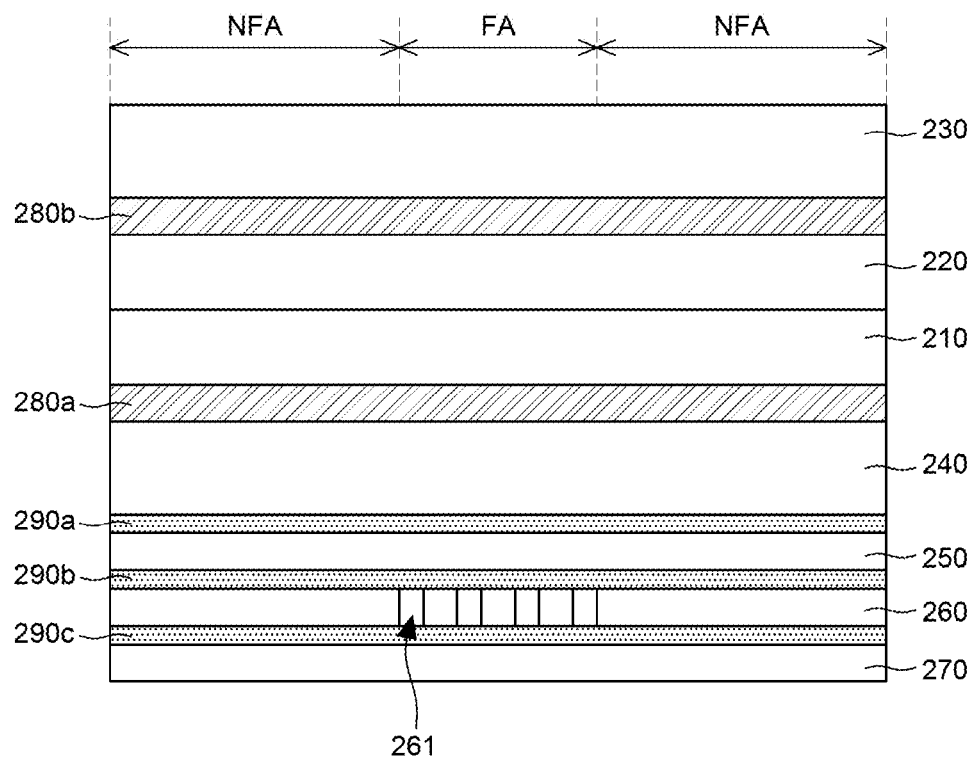
FIG. 3 is a schematic cross-sectional view of a foldable display device according to an embodiment of the present disclosure.

FIG. 3 is a schematic cross-sectional view of a foldable display device according to an embodiment of the present disclosure.

Some components in FIG. 3 are substantially the same as and similar to those described in FIG. 1 and thus, descriptions thereof will be omitted.

A back plate 240, a second support layer 250, a first support layer 260, and an impact absorbing layer 270 are sequentially disposed on a rear surface of the display panel 210, and a cover window 230 is located in front of the display panel 210. In addition, a touch panel 220 is positioned between the display panel 210 and the cover window 230. The respective components adhere and are attached to one another through adhesives 280a, 280b, 290a, 290b, 290c.

The back plate 240 is attached to the rear surface of the display panel 210 to support the display panel 210 since a substrate 101 of the display panel 210 is too thin. The back plate 240 may be formed of a metal material such as stainless steel (SUS) or a polymer such as polymethylmetacrylate (PMMA), polycarbonate (PC), polyvinylalcohol (PVA), acrylonitrile-butadiene-styrene (ABS), polyethylene terephthalate (PET), silicone, or polyurethane (PU).

The first support layer 260 is also referred to as a plate bottom. The first support layer 260 may include an opening pattern 261 in a portion thereof corresponding to a folding area FA of a foldable display device 200. An elastic deformation region is increased by the opening pattern 261 formed in the folding area FA, thereby allowing for restoration. In some embodiments, the opening pattern 261 is an open, void area (e.g., filled with air). In other embodiments, the opening pattern 261 is a void area filled with any suitable materials so that the opening pattern 261 serves as a spring, so that elastic restoration energy increases, thereby allowing for a reduction in restoration time. Therefore, folding characteristics of the foldable display device 200 may be improved. In addition, the first support layer 260 may serve to prevent transfer caused by a set. The first support layer 260 is formed of a metal material such as stainless steel (SUS), but is not limited thereto. The first support layer 260 may also be formed of a polymer such as polymethylmetacrylate (PMMA), polycarbonate (PC), polyvinyl alcohol (PVA), acrylonitrile-butadiene-styrene (ABS), polyethylene terephthalate (PET), silicone, or polyurethane (PU).

The second support layer 250 is also referred to as a plate top. The second support layer 250 is disposed between the back plate 240 and the first support layer 260 and can enhance rigidity of the display panel 210. Further, the second support layer 250 may function to prevent the opening pattern 261 from being viewed through the display panel. The second support layer 250 may be formed of a metal material such as stainless steel (SUS) which includes iron (Fe) or other metals, for example, chromium (Cr) and nickel (Ni) contained in the iron, aluminum (Al), or magnesium (Mg), but is not limited thereto. The second support layer 250 may be formed of a polymer such as polymethylmetacrylate (PMMA), polycarbonate (PC), polyvinyl alcohol (PVA), acrylonitrile-butadiene-styrene (ABS), polyethylene terephthalate (PET), silicone, or polyurethane (PU).

As described above, since a foldable display device should be able to be folded and unfolded, all of a back plate and a cover window, as well as a display panel, are configured in a very thin film form, and such a thin film form transmits most of impacts transmitted from the outside, vertically.

For example, when an impact is transmitted from the outside to the cover window, the impact transmitted to the cover window is transmitted to a touch panel or the display panel positioned under the cover window.

Thus, electrodes of a touch sensor of the touch panel or elements of the display panel are damaged. Accordingly, the inventors have invented a new structure of a foldable display device to solve limitations described above.

The impact absorbing layer 270 may be disposed under the first support layer 260. The impact absorbing layer 270 may minimize transmission of impacts which are applied from the outside to the touch panel or the display panel 210. The impact absorbing layer 270 may be formed of silicone, silicone foam, acrylic foam, polypropylene foam, polyurethane (PU), polyurethane foam, or thermoplastic polyurethane (TPU), but is not limited thereto.

Here, the impact absorbing layer 270 has a thickness of 100 μm to 1000 μm. When the impact absorbing layer has a thickness of less than 100 μm, impact absorption capacity is insignificant, and when the impact absorbing layer has a thickness of greater than 1000 μm, it may cause difficulties in folding the foldable display device.

Figure 4:
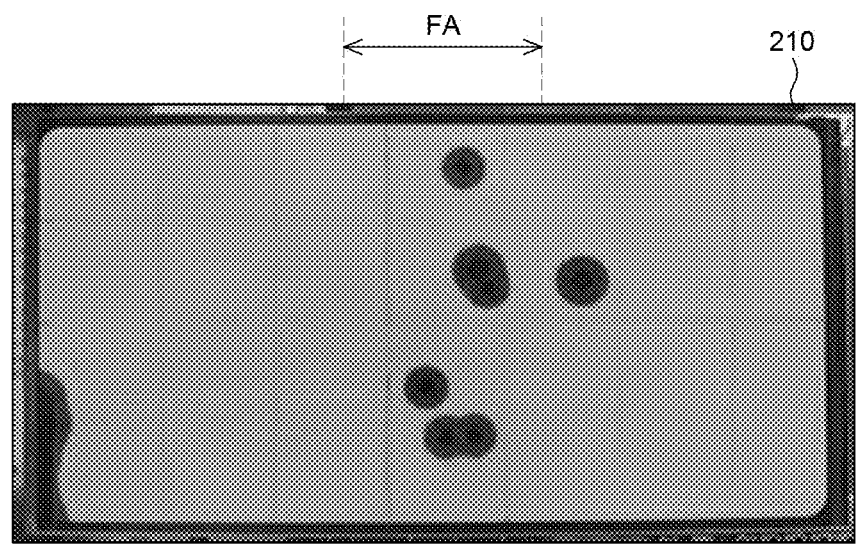
FIG. 4 is a photograph showing a ball drop test result of the foldable display device according to an embodiment of the present disclosure.

However, the inventors have found a vulnerability in the structure as described above. FIG. 4 is a photograph showing a ball drop test result of the foldable display device of FIG. 3. With reference to FIG. 4, it can be seen that the folding area FA of the display panel 210 was damaged due to point impacts. The point impact which is an impact exerted on a local region may apply stronger damage to the display panel, than that of a surface impact applied to the entire surface.

When a point impact is applied from the outside, the point impact is converted into a surface impact in a non-folding area of the first support layer, having no opening pattern, so that the impact can be absorbed well. However, since the opening pattern is present in a folding area of the first support layer to improve folding characteristics, when a point impact is applied to an upper portion of the folding area, it cannot be converted into a surface impact, causing damage to the display panel or the touch panel. Accordingly, the inventors have recognized this problem and invented a new structure of the impact absorbing layer.

Figure 5:
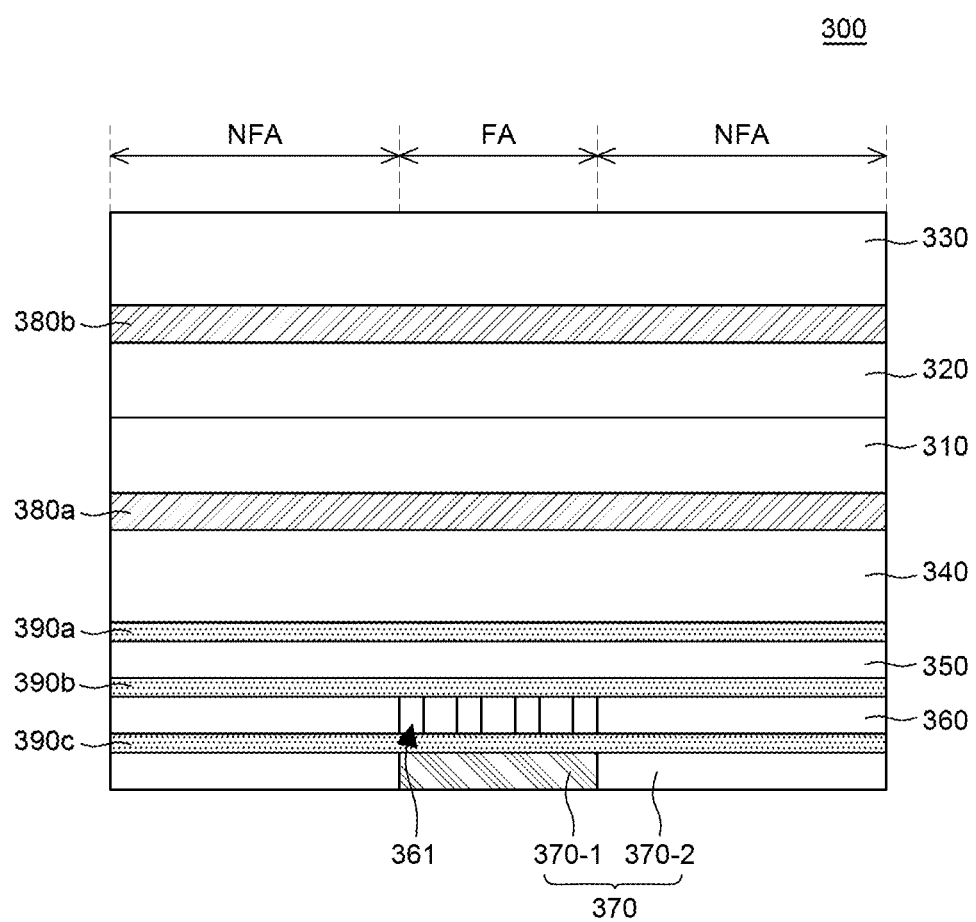
FIG. 5 is a schematic cross-sectional view of a foldable display device according to another embodiment of the present disclosure.

FIG. 5 is a cross-sectional view schematically illustrating a foldable display device 300 according to another embodiment of the present disclosure.

With reference to FIG. 5, the foldable display device 300 according to another embodiment of the present disclosure may include a display panel 310. A cover window 330 is located in front of the display panel 310. In addition, a touch panel 320 is positioned between the display panel 310 and the cover window 330. The display panel 310 may include a folding area FA and non-folding areas NFA on both sides of the folding area FA. A back plate 340 is disposed under the display panel 310. A first support layer 360 having an opening pattern 361 in a portion thereof corresponding to the folding area FA is disposed under the back plate 340. An impact absorbing layer 370 is disposed under the first support layer 360. The impact absorbing layer 370 includes a first portion 370-1 corresponding to the folding area FA and a second portion 370-2 corresponding to the non-folding areas NFA. The impact absorbing layer 370 may be formed of a material in which a modulus of the first portion 370-1 is higher than that of the second portion 370-2. That is, the first portion 370-1 may be formed of a material having a modulus of elasticity greater than that of the second portion 370-2. The respective components adhere and are attached to one another through adhesives 380a, 380b, 390a, 390b, 390c.

The first portion 370-1 may be formed of at least one of silicone, silicone foam, acrylic foam, polypropylene foam, polyurethane (PU), polyurethane foam, and thermoplastic polyurethane (TPU).

The first portion 370-1 has a modulus value of 1 MPa to 30 MPa, and the first portion 370-1 has a thickness of 100 μm to 1000 μm. When the first portion 370-1 has a thickness of less than 100 μm, impact absorption capacity is insignificant, and when the first portion 370-1 has a thickness of greater than 1000 μm, it may cause difficulties in folding the foldable display device 300.

The second portion 370-2 may be formed of at least one of silicone, silicone foam, acrylic foam, polypropylene foam, polyurethane (PU), polyurethane foam, and thermoplastic polyurethane (TPU).

The second portion 370-2 has a modulus value of 10 KPa to 1000 KPa, and the second portion 370-2 has a thickness of 100 μm to 1000 μm. When the second portion 370-2 has a thickness of less than 100 μm, impact absorption capacity is insignificant, and when the second portion 370-2 has a thickness of greater than 1000 μm, it may cause difficulties in folding the foldable display device 300.

TABLE 1

| Impact Absorbing Layer | First Support Layer | |
| --- | --- | --- |
| | Opening Pattern (present) | Opening Pattern (not present) |
| None | 2.5 cm | 2.5 cm |
| 4 MPa | 12.5 cm | 2.5 cm |
| 10 MPa | 10 cm | 2.5 cm |
| 10 KPa | 2.5 cm | 15 cm |
| 20 KPa | 2.5 cm | 15 cm |

Table 1 above shows ball drop test results indicating heights of points in time at which damage to the display panel occurred according to the modulus of the impact absorbing layer 370 and the presence or absence of the opening pattern of the first support layer 360. With reference to Table 1 above, in a case in which the modulus of the first portion 370-1 having the opening pattern 361 was relatively high (4 MPa or 10 MPa), when a ball was dropped, it can be confirmed that a height at which damage to the display panel 310 occurred was 10 cm or more. However, in a case in which the modulus of the first portion 370-1 having the opening pattern 361 was relatively low (10 KPa or 20 KPa), it can be confirmed that damage to the display panel 310 occurred when the ball was dropped at a height of 2.5 cm. On the other hand, when the modulus of the second portion 370-2 having no opening pattern 361 was relatively high (4 MPa or 10 MPa), damage to the display panel 310 occurred when the ball was dropped at a height of 2.5 cm. However, when the modulus of the second portion 370-2 having no opening pattern 361 was relatively low (10 KPa or 20 KPa), it can be confirmed that damage to the display panel 310 occurred when the ball was dropped at a height of 15 cm.

Through this, in the foldable display device 300 according to the embodiment of the present disclosure, the impact absorbing layer 370 is disposed such that the modulus of the first portion 370-1 of the impact absorbing layer 370 corresponding to the folding area FA has a relatively large value (1 to 30 MPa) and the modulus of the second portion 370-2 of the impact absorbing layer 370 corresponding to the non-folding area NFA has a value smaller than the modulus of the first portion 370-1. Thus, as compared to a general foldable display device, even when an external impact is applied to the foldable display device 300, the impact is partially alleviated to thereby improve impact resistance characteristics of the touch panel 320 or the display panel 310.

A second support layer 350 may be further included between the back plate 340 and the first support layer 360. The second support layer 350 may enhance rigidity of the display panel 310. Further, the second support layer 250 may function to prevent the opening pattern 361 from being viewed through the display panel 310.

The second support layer 350 may be formed of a metal material such as stainless steel (SUS) which includes iron (Fe) or other metals, for example, chromium (Cr) and nickel (Ni) contained in the iron, aluminum (Al), or magnesium (Mg), but is not limited thereto. The second support layer 350 may be formed of a polymer such as polymethyl-metacrylate (PMMA), polycarbonate (PC), polyvinyl alcohol (PVA), acrylonitrile-butadiene-styrene (ABS), polyethylene terephthalate (PET), silicone, or polyurethane (PU).

Meanwhile, in the description so far, it is described and illustrated that the touch panel 320 is located over the display panel 310 on which an image is implemented, in the foldable display device 300. However, in other embodiments, the touch panel 320 can be omitted.

The foldable display device 300 according to another embodiment of the present disclosure may include the display panel 310. The display panel 310 may include the folding area FA and the non-folding areas NFA on both sides of the folding area FA. The first support layer 360 having the opening pattern 361 in a portion thereof corresponding to the folding area FA may be under the display panel 310. The impact absorbing layer 370 is disposed under the first support layer 360. The impact absorbing layer 370 includes the first portion 370-1 corresponding to the folding area FA and the second portion 370-2 corresponding to the non-folding areas NFA. In the impact absorbing layer 370, the modulus of the first portion 370-1 has a value greater than that of the second portion 370-2 to reduce damage to the display panel 310 caused by a point impact applied to the folding area FA.

The first portion 370-1 may convert the point impact applied to the folding area FA of the display panel 310 into a surface impact to prevent shape deformation of the folding area FA. The opening pattern 361 is not formed in the first support layer 360 corresponding to the second portion 370-2. Therefore, the first support layer 360 can convert a point impact applied from the outside into a surface impact. However, since the opening pattern 361 is formed in the first support layer 360 corresponding to the first portion 370-1 so as to improve folding characteristics, the point impact cannot be converted into a surface impact due to the opening pattern 361. Accordingly, the first portion 370-1 corresponding to the opening pattern 361 has a high modulus value in order to convert the point impact into a surface impact. That is, the first portion 370-1 may be formed of a material having a modulus of elasticity greater than that of the second portion 370-2.

The first portion 370-1 may be formed of at least one of silicone, silicone foam, acrylic foam, polypropylene foam, polyurethane (PU), polyurethane foam, and thermoplastic polyurethane (TPU).

The first portion 370-1 has a modulus value of 1 to 30 MPa, and the first portion 370-1 has a thickness of 100 to 1000 µm. When the first portion 370-1 has a thickness of less than 100 µm, impact absorption capacity is insignificant, and when the first portion 370-1 has a thickness of greater than 1000 µm, it may cause difficulties in folding the foldable display device 300.

The second portion 370-2 may be formed of at least one of silicone, silicone foam, acrylic foam, polypropylene foam, polyurethane (PU), polyurethane foam, and thermoplastic polyurethane (TPU).

The second portion 370-2 has a modulus value of 10 KPa to 1000 KPa, and the second portion 370-2 has a thickness of 100 µm to 1000 µm. When the second portion 370-2 has a thickness of less than 100 µm, impact absorption capacity is insignificant, and when the second portion 370-2 has a thickness of greater than 1000 µm, it may cause difficulties in folding the foldable display device 300.

In the foldable display device 300 according to an embodiment of the present disclosure, the first portion 370-1 of the impact absorbing layer 370 corresponding to the folding area FA of the display panel 310 is formed of a material having a high modulus. Thus, even when a point impact is applied to the folding area FA, the point impact is converted into a surface impact, so that damage to the display panel 310 or the touch panel 320 by the point impact can be prevented more effectively. Consequently, impact resistance characteristics of the display device 300 may be improved.

Although the embodiments of the present disclosure have been described in detail with reference to the accompanying drawings, the present disclosure is not limited thereto and may be embodied in many different forms without departing from the technical concept of the present disclosure. Therefore, the embodiments of the present disclosure are provided for illustrative purposes only but not intended to limit the technical concept of the present disclosure. The scope of the technical concept of the present disclosure is not limited thereto. Therefore, it should be understood that the above-described embodiments are illustrative in all aspects and do not limit the present disclosure. The protective scope of the present disclosure should be construed based on the following claims, and all the technical concepts in the equivalent scope thereof should be construed as falling within the scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A foldable display device, comprising:
    a display panel including a folding area and non-folding area adjacent to the folding area, the display panel including a flexible substrate, a light emitting element disposed on the flexible substrate, and an encapsulation layer disposed on the light emitting element;

a back plate disposed under the display panel;

a first support layer disposed under the back plate;

a first adhesive layer between the back plate and the first support layer;

a second adhesive layer between the back plate and the display panel;

an opening pattern included in the first support layer, the opening pattern arranged in a portion corresponding to the folding area;

a cover window for protecting the display panel;

a third adhesive layer between the cover window and the display panel;

a touch sensor disposed on the encapsulation layer; and a foreign material compensation layer disposed on the touch sensor, wherein the foreign material compensation layer includes an organic material, wherein the display panel includes:

a thin film transistor;

a first planarization layer disposed on the thin film transistor;

a second planarization layer sequentially stacked on the first planarization layer;

a light emitting element disposed on the second planarization layer, the light emitting element including an anode, a light emitting unit, and a cathode; and an intermediate electrode disposed on the first planarization layer, the intermediate electrode coupled to the anode and the thin film transistor.

2. The foldable display device of claim 1, wherein the foreign material compensation layer includes either an acrylic-based material or an epoxy-based resin.

3. The foldable display device of claim 1, wherein when a defect occurs due to a crack generated by a foreign material, the foreign material compensation layer covers the crack and the foreign material.

4. The foldable display device of claim 1, comprising: a second support layer between the back plate and the first support layer.

5. The foldable display device of claim 1, comprising:
a plurality of barrier films disposed on the display panel, wherein at least one of the foreign material compensation layer and the plurality of barrier films includes an acrylic-based material.

6. The foldable display device of claim 1, wherein the back plate and the first support layer are spaced apart from each other.

7. The foldable display device of claim 1, wherein the opening pattern is an empty space having air within.

8. The foldable display device of claim 1, wherein the opening pattern includes within its space materials that increase elastic restoration energy.

9. The foldable display device of claim 1, wherein both the first and second adhesive layers overlap with the opening pattern from a plan view.

10. The foldable display device of claim 1, comprising:
an impact absorbing layer disposed under the first support layer;
a fourth adhesive layer between the impact absorbing layer and the first support layer.

11. The foldable display device of claim 10, wherein the fourth adhesive layer directly contacts the opening pattern.

12. The foldable display device of claim 10, wherein the impact absorbing layer includes a first portion and a second portion, the first portion overlapping the folding area and the second portion overlapping the non-folding area from a plan view.

13. The foldable display device of claim 10, wherein the cover window and the back plate include at least one material that is common to both the cover window and back plate.

14. The foldable display device of claim 10, wherein the second support layer and the back plate include at least one material that is common to both the second support layer and back plate.

15. The foldable display device of claim 13, wherein the at least one material that is common includes a polymer.

16. The foldable display device of claim 1, wherein
the thin film transistor includes a gate electrode, source electrode, a drain electrode, and a semiconductor layer.

17. The foldable display device of claim 16, further comprising:
a first contact hole within the first planarization layer; and
a second contact hole within the second planarization layer.

18. The foldable display device of claim 17, wherein the first contact hole within the first planarization layer and the second contact hole within the second planarization layer overlap each other from a plan view.

19. The foldable display device of claim 18, wherein the intermediate electrode is located in the first contact hole and electrically connects to either a source or drain electrode of the thin film transistor.

20. The foldable display device of claim 19, wherein the anode of the light emitting element extends into the second contact hole to electrically connect with the intermediate electrode.

* * * * *